(12) United States Patent
Wang et al.

(10) Patent No.: US 12,132,297 B2
(45) Date of Patent: Oct. 29, 2024

(54) VERTICAL CAVITY SURFACE EMITTING LASER (VCSEL) ARRAY AND MANUFACTURING METHOD

(71) Applicant: Shenzhen Raysees AI Technology Co. Ltd., Shenzhen (CN)

(72) Inventors: Yang Wang, Dublin, CA (US); Yongxiang He, Sunnyvale, CA (US)

( * ) Notice: Subject to any disclaimer, the term of this patent is extended or adjusted under 35 U.S.C. 154(b) by 877 days.

(21) Appl. No.: 17/294,446

(22) PCT Filed: Sep. 25, 2018

(86) PCT No.: PCT/CN2018/107359
§ 371 (c)(1),
(2) Date: May 17, 2021

(87) PCT Pub. No.: WO2020/061749
PCT Pub. Date: Apr. 2, 2020

(65) Prior Publication Data
US 2021/0408768 A1    Dec. 30, 2021

(51) Int. Cl.
*H01S 5/00* (2006.01)
*H01S 5/0225* (2021.01)
*H01S 5/0234* (2021.01)
*H01S 5/042* (2006.01)
*H01S 5/183* (2006.01)
*H01S 5/42* (2006.01)
*H01S 5/02345* (2021.01)

(52) U.S. Cl.
CPC ............ *H01S 5/423* (2013.01); *H01S 5/0225* (2021.01); *H01S 5/0234* (2021.01); *H01S 5/04256* (2019.08); *H01S 5/18361* (2013.01); *H01S 5/02345* (2021.01); *H01S 5/42* (2013.01)

(58) Field of Classification Search
CPC ...... H01S 5/423; H01S 5/0225; H01S 5/0234; H01S 5/04256; H01S 5/18361; H01S 5/02345; H01S 5/42
See application file for complete search history.

(56) References Cited

U.S. PATENT DOCUMENTS

| 2003/0007257 A1 | 1/2003 | Bernard et al. |
| 2008/0080583 A1* | 4/2008 | Ueki ................. H01S 5/04254 372/50.124 |

(Continued)

FOREIGN PATENT DOCUMENTS

| CN | 101154792 | 4/2008 |
| CN | 104798271 A | 7/2015 |

(Continued)

OTHER PUBLICATIONS

Office action issued Nov. 1, 2022, in Chinese patent application No. 201880099645.1 (with English language translation by sipo).

*Primary Examiner* — Kinam Park
(74) *Attorney, Agent, or Firm* — Jigang Jin (57) ABSTRACT

The present invention discloses a VCSEL array that can function in at least two different operational modes. In one operational mode, the VCSEL array functions as a regular-patterned array; and in the other operational mode, the VCSEL array functions as an irregular-patterned array. Thus, the same VCSEL chip may be used as an illumination light source or a structural light method light source for 3D sensing, depending on the selected operational mode.

17 Claims, 6 Drawing Sheets

(56) References Cited

U.S. PATENT DOCUMENTS

| | | |
|---|---|---|
| 2008/0240196 A1 | 10/2008 | Nishida |
| 2012/0293625 A1 | 11/2012 | Schneider et al. |
| 2013/0266326 A1* | 10/2013 | Joseph ............... H04B 10/1141 398/130 |
| 2013/0272330 A1 | 10/2013 | Joseph et al. |
| 2015/0316368 A1* | 11/2015 | Moench ................ H04N 5/265 348/136 |
| 2015/0340841 A1 | 11/2015 | Joseph |
| 2016/0072258 A1 | 3/2016 | Seurin et al. |
| 2016/0328091 A1 | 11/2016 | Wassvik et al. |
| 2016/0352074 A1* | 12/2016 | Hogan ................. H01S 5/4043 |
| 2017/0033535 A1* | 2/2017 | Joseph ............... H01S 5/18308 |
| 2018/0062345 A1* | 3/2018 | Bills .................... G01S 7/4815 |
| 2018/0209616 A1* | 7/2018 | Lee ....................... H01L 33/62 |
| 2019/0038913 A1* | 2/2019 | Beerwerth ........... A61N 5/0617 |
| 2019/0109436 A1 | 4/2019 | Hegblom |
| 2020/0225501 A1* | 7/2020 | Bakin ................ G01B 11/2513 |
| 2020/0300977 A1* | 9/2020 | Rowlands ............... G01S 7/486 |
| 2020/0355494 A1* | 11/2020 | Rossi ................. G02B 27/4277 |
| 2020/0358257 A1* | 11/2020 | Gronenborn .......... H01S 5/0207 |
| 2021/0376574 A1* | 12/2021 | Wang ..................... H01S 5/423 |

FOREIGN PATENT DOCUMENTS

| | | |
|---|---|---|
| CN | 105874662 | 8/2016 |
| CN | 108141005 | 6/2018 |
| CN | 108347502 | 7/2018 |
| CN | 208368943 U | 1/2019 |
| JP | 2009194101 | 8/2009 |
| JP | 2009194101 A | 8/2009 |
| JP | 2016025129 A | 2/2016 |
| JP | 2017098532 A | 6/2017 |

\* cited by examiner

VERTICAL CAVITY SURFACE EMITTING LASER (VCSEL) ARRAY AND MANUFACTURING METHOD

CROSS-REFERENCE TO RELATED APPLICATIONS

This application is the U.S. National Stage of International Application No. PCT/CN2018/107359, filed Sep. 25, 2018, the content of which is incorporated herein by reference in its entirety.

TECHNICAL FIELD

This invention generally relates to Vertical Cavity Surface Emitting Laser (VCSEL) array and to the manufacturing method of VCSEL arrays.

BACKGROUND ART

Three-dimensional (3D) sensing represents a future trend of smartphones. The 3D sensing technology is also expected to enhance the functions of robots, drones, and autonomous vehicles. Compared to conventional cameras which provide two-dimensional information, 3D sensing captures the depth data in addition to a flat image and thus enables accurate facial recognition, object recognition, gesture sensing, and environmental sensing. Moreover, it enhances augmented reality (AR) and virtual reality (VR) capabilities as well. 3D sensing includes the Time-of-Flight (TOF) method and the structured light method. In the TOF approach, the depth data is obtained by measuring the traveling time of light emitted from a light source, reflected from an object, and finally detected by a sensor. In the structured light approach, a predetermined pattern of dots is projected onto an object. The pattern is distorted after it is reflected by the 3D shape of the object. The depth data of the object is calculated by analyzing changes in the pattern. VCSEL arrays may be used as light sources for the TOF and the structured light methods. For instance, the TOF method may use a VCSEL array with a regular pattern where VCSELs are configured in a matrix format. The structured light method may use a patterned VCSEL array, where VCSELs form a predetermined irregular pattern of dots.

A VCSEL emits an output beam in the direction perpendicular to its top and bottom surfaces. To become a VCSEL array, a VCSEL chip may contain multiple VCSELs which generate multiple output beams. For instance, thousands of VCSELs may be formed on a chip. Thanks to the surface emitting feature, wafer-level processing and surface-mount techniques, which are well developed in the semiconductor industry, can be utilized to manufacture VCSEL array devices in high volume inexpensively. Because of a narrow spectrum and stability with respect to temperature, plus low cost and small size, VCSEL arrays are becoming the dominant light source in 3D sensing implementations.

In illumination applications, VCSEL emitters in a VCSEL array are arranged in a regular pattern. One often-used regular pattern is matrix, where the spacing between any two adjacent VCSEL emitters in a row or column is the same. For instance, a 30×30 VCSEL array has thirty emitters in each row and each column and the centers of any two adjacent emitters may be, for instance, a constant value of forty micrometers.

In structured light method of 3D sensing, however, the VCSEL emitters of a VCSEL array are arranged in a predetermined irregular pattern, which is determined by the specific algorithm used in the structured light method. Examples include random and pseudo-random patterns depending on the design. A regular-patterned VCSEL array may be made by the same fabrication method as an irregular-patterned VCSEL array. Take a top-emitting VCSEL array for example. When a regular-patterned VCSEL array is made, VCSELs are formed on a substrate in a regular pattern. The VCSELs share a common cathode terminal and are separated from each other by isolation trenches. A contact is formed on top of each VCSEL. In the last fabrication step(s), a metal layer is deposited above the VCSELs to connect all these top contacts. When an irregular-patterned VCSEL array is made, VCSELs are formed on a substrate in a predetermined irregular pattern. The VCSELs share a common cathode terminal and are separated by isolation trenches. Similarly, a contact is formed on top of each VCSEL. In the last fabrication step(s), a metal layer is deposited to connect all top contacts of the VCSELs. The main difference between making a regular-patterned VCSEL array and making an irregular-patterned VCSEL array is that they use different sets of masks. While the manufacturing process fully utilizes current fabrication techniques and processes, it is limited to only one design of patterned array, a regular pattern or a predetermined irregular pattern. Consequently, a regular-patterned VCSEL array and an irregular-patterned VCSEL array have to be designed and manufactured separately in order to meet different needs. A VCSEL array is either a regular-patterned array or an irregular-patterned array.

SUMMARY OF INVENTION

Technical Problem

The present invention discloses a VCSEL array that can function in at least two different operational modes. In one operational mode, the VCSEL array functions as a regular-patterned array; and in the other operational mode, the VCSEL array functions as an irregular-patterned array. Thus, the same VCSEL chip may be used as an illumination light source or a structured light method light source for 3D sensing, depending on the selected operational mode.

Solution to Problem

Technical Solution

In one embodiment, a VCSEL array comprises a substrate and a plurality of VCSEL structures formed in a regular pattern on the substrate. The VCSEL structures share one electrode (e.g., the cathode terminal) and each have a contact serving as the other electrode (e.g., the anode terminal). A first customized metal layer is deposited above the plurality of VCSEL structures to electrically connect the contacts of a selected number but not all of the plurality of VCSEL structures. The selected VCSEL structures form an array of a predetermined irregular pattern. A second customized metal layer is deposited above the plurality of VCSEL structures to electrically connect the contacts of the remaining VCSEL structures. In one operational mode, the selected VCSELs are powered on to function as an irregular-patterned array. In another operational mode, all of the VCSELs are powered on to function as a regular-patterned array.

In another embodiment of the present invention, a VCSEL array comprises a substrate, a plurality of VCSEL structures formed in a regular pattern on the substrate, and an optical component mounted above the plurality of VCSEL structures. The plurality of VCSEL structures share one electrode (e.g., the cathode terminal) and each have a contact serving as the other electrode (e.g., the anode terminal). The optical component has a first and a second customized metal layer with contact pads formed on its bottom surface. The contact pads of the first metal layer are arranged in a mirror image of a predetermined irregular pattern. The contact pads of the first and second metal layers together form a mirror image of the regular pattern. After the optical component is mounted above the plurality of VCSEL structures, each of the contact pads is electrically bonded with a corresponding contact of a VCSEL structure. As a result, a selected number but not all of the plurality of VCSEL structures are electrically connected by the contact pads of the first metal layer. The VCSEL structures which are connected to the contact pads of the first metal layer form an array of the predetermined irregular pattern. In one operational mode, the VCSEL structures, which are connected to the contact pads of the first metal layer, are powered on to function as an irregular-patterned array. In another operational mode, all of the VCSEL structures are powered on to function as a regular-patterned array.

In yet another embodiment, a VCSEL array comprises a plurality of VCSEL structures mounted on a submount via the flip-chip method. The plurality of VCSEL structures are arranged in a regular pattern and share one electrode (e.g., the cathode terminal). Each VCSEL structure has a contact serving as the other electrode (e.g., the anode terminal). The submount has a first and a second customized metal layers with contact pads formed on its top surface. The contact pads of the first metal layer are arranged in an image of a predetermined irregular pattern. The contact pads of the first and second metal layers together form an image of the regular pattern. After the plurality of VCSEL structures are mounted on the submount, each of the contact pads is electrically bonded with a corresponding contact of a VCSEL structure. As a result, a selected number but not all of the plurality of VCSEL structures are electrically connected by the contact pads of the first metal layer. The VCSEL structures which are connected to the contact pads of the first metal layer form an array of the predetermined irregular pattern. In one operational mode, the VCSEL structures, which are connected to the contact pads of the first metal layer, are powered on to function as an irregular-patterned array. In another operational mode, all of the VCSEL structures are powered on to function as a regular-patterned array.

In yet another embodiment of the present invention, the two or more customized metal layers discussed in the previous embodiments may be fabricated as separate parts or portions of a single metal layer electrically insulated by nonconductive material (e.g., Silicon Nitride).

Advantageous Effects of Invention

Advantageous Effects

The present invention has advantages over prior art arrays because a VCSEL array may be used either a regular-patterned array for illumination applications or an irregular-patterned array for structured light 3D sensing applications.

BRIEF DESCRIPTION OF DRAWINGS

Description of Drawings

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings. Additionally, the leftmost digit of a reference number identifies the drawing in which the reference number first appears.

MODE FOR THE INVENTION

Mode for Invention

Figure 1:
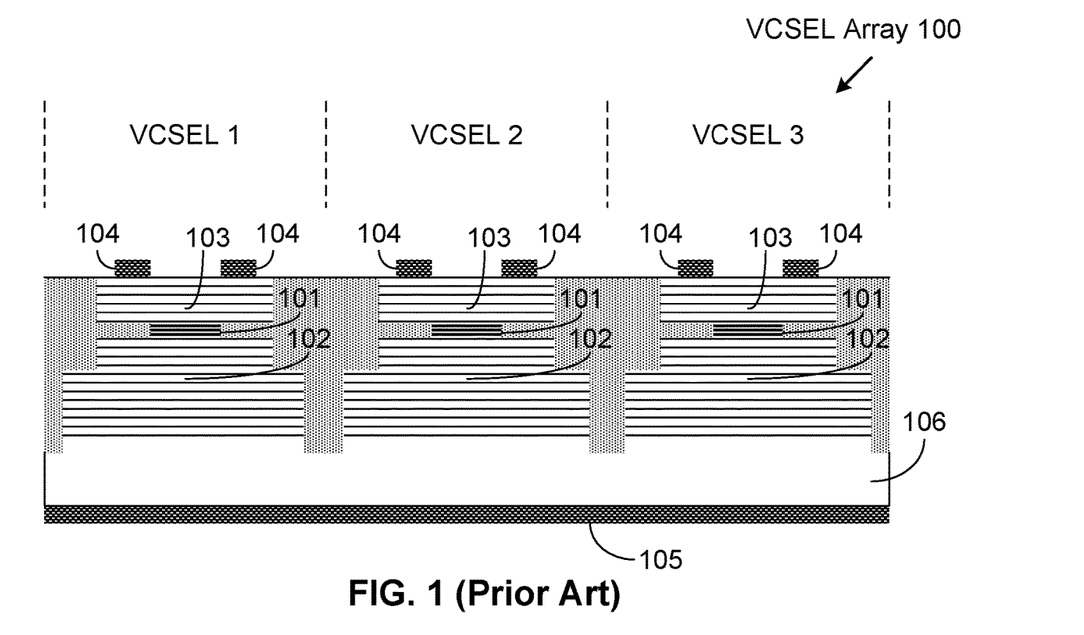
FIG. 1 illustrates a cross-sectional view of a prior art VCSEL array with a regular pattern.

FIG. 1 illustrates a prior art VCSEL array 100 in a cross-sectional view. Array 100 comprises VCSELs 1, 2, and 3 on a substrate 106. It should be noted that the array 100 may comprise thousands of VCSELs and only three VCSELs are shown here for simplification purposes. Similarly, in other figures and descriptions below, only a few VCSELs or part of an array are shown for simplification purposes. VCSEL 1, 2, or 3 represents a VCSEL structure or VCSEL emitter which emits a laser beam when charged with an electrical current. As used herein, a VCSEL, VCSEL structure, and VCSEL emitter have the same meaning and may be used interchangeably. As shown, each VCSEL includes an active region 101 and reflector regions 102 and 103. For a typical VCSEL, active region 101 may contain a multiple-quantum-well (MQW) structure, reflector region 102 may contain an n-type Distributed Bragg Reflector (DBR), and reflector region 103 may contain a p-type DBR. The quantum well region and DBRs are grown on substrate 106 in an epitaxial process. Substrate 106 has n-type doping. Reflector regions 102 and 103 and substrate 106 are electrically conductive. Metal contacts 104 are deposited on the p-type DBR regions. Metal layer 105 is deposited on the bottom surface of substrate 106. Metal layers 104 and 105 serve as the anode and cathode terminals, respectively.

As shown in FIG. 1, the plurality of VCSELs shares a common cathode but are separated by isolation trenches. When the array is in operation or electrically charged, each VCSEL emitter generates a laser beam. These VCSEL emitters are arranged in a regular pattern. For purpose of illustration, a VCSEL array of a regular or irregular pattern may also be called a regular-patterned or irregular-patterned VCSEL array.

A regular pattern, as used herein, may mean various configurations that follow certain rules. Examples of regular patterns include elements with equal spacing in one or more rows, elements with equal spacing in rows and columns, elements with equal spacing in concentric circles, etc. An irregular pattern, as used herein, may mean various configurations which don't follow any rule. Irregular patterns include random or pseudorandom patterns.

Figure 2:
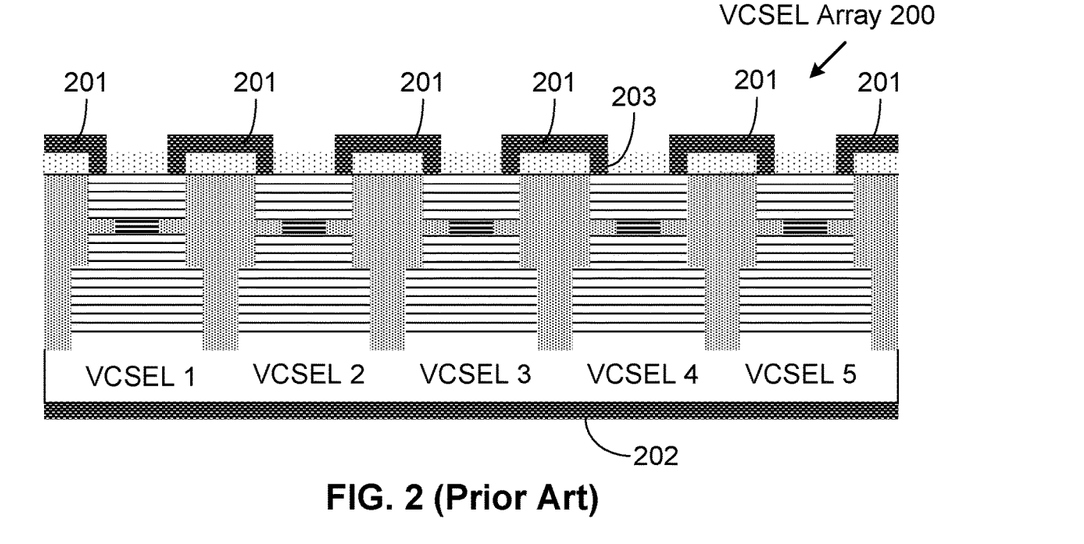
FIG. 2 illustrates a cross-sectional view of a prior art VCSEL array with a regular pattern.

Prior art regular-patterned and irregular-patterned VCSEL arrays may be made with the same fabrication process, except using different lithographic masks. Both types of arrays have a common cathode terminal and connected anode terminals. All of the anode terminals are electrically connected by a metal layer in both cases. For instance as shown in FIG. 2, a prior art regular-patterned VCSEL array 200 contains five emitters from VCSEL 1 to VCSEL 5. A metal layer 202, serving as the common cathode, is deposited on the bottom substrate surface. An insulation layer (e.g. Silicon Nitride) is deposited on the top surfaces of p-type reflector regions. A plurality of vias 203 are etched on the insulation. A metal layer 201 is deposited to electrically connect all VCSELs through the vias. Array 200 represents a regular-patterned VCSEL array, where the emitters are configured in a regular pattern and all of the VCSEL are turned on when the array is in operation.

Figure 3:
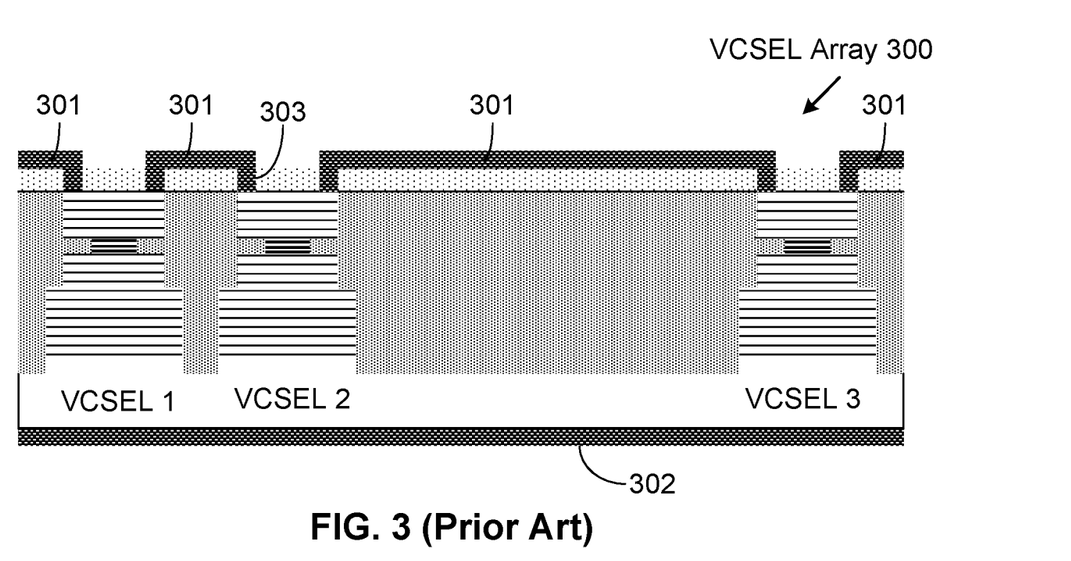
FIG. 3 illustrates a cross-sectional view of a prior art VCSEL array with a predetermined pattern.

In FIG. 3, a prior art VCSEL array 300 is depicted. Array 300 contains VCSELs 1, 2, and 3, where the VCSELs are configured in a predetermined pattern. Like array 200 of FIG. 2, VCSELs 1, 2, and 3 have a common cathode 302. A metal layer 301 electrically connects the VCSELs through vias 303. When array 300 is turned on, a predetermined pattern of VCSEL emitters is formed. Thus, when a prior art method is used to make a VCSEL array, the array has a fixed pattern, either a regular pattern or an irregular pattern. After a VCSEL array is made, its pattern is fixed and can't be changed.

Figure 4:
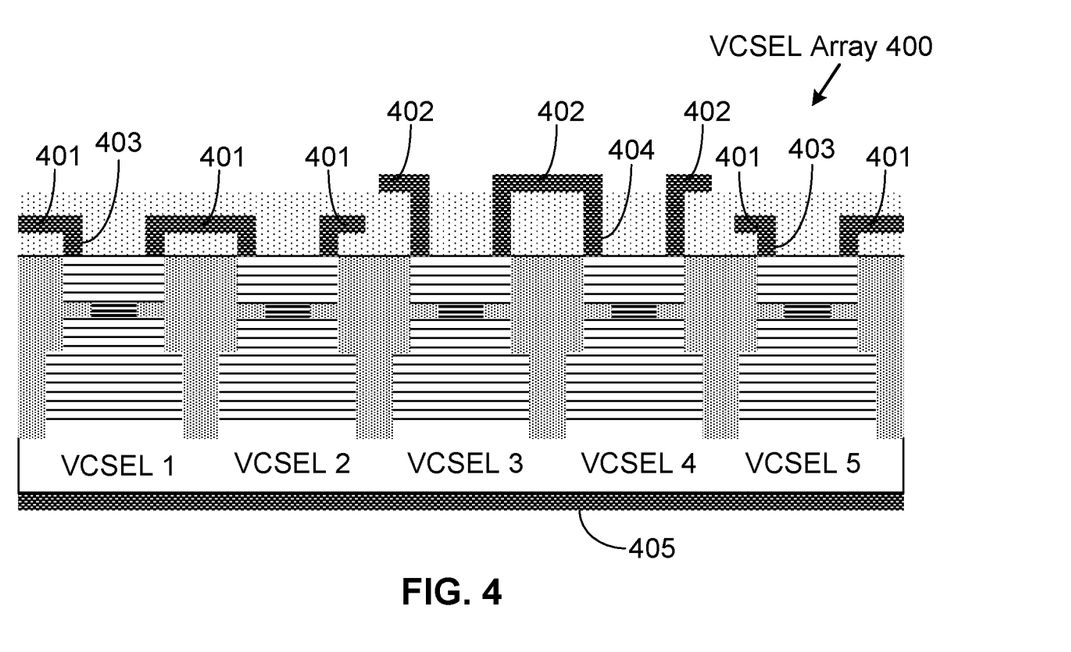
FIG. 4 illustrates a cross-sectional view of an exemplary VCSEL array, according to one embodiment of the present invention.

FIG. 4 illustrates an exemplary VCSEL array 400 in a cross-sectional view, according to one embodiment of the present invention. As shown, array 400 includes five VCSEL emitters from VCSEL 1 to VCSEL 5. A metal layer 405 is deposited on the bottom surface of the substrate and serves as the common cathode terminal for the VCSELs. Two metal layers 401 and 402 are deposited above the epitaxial regions, for example, in a sequential manner. Metal layer 401 is arranged to electrically connect VCSELs 1, 2, and 5 through vias 403. Metal layer 402 is configured to electrically connect VCSELs 3 and 4 through vias 404. The sections of layer 401 and 402 are respectively linked via connections not shown in the figure.

Hence, metal layers 401 and 402 are electrically connected to different VCSELs and thus may create VCSEL arrays with different patterns. For instance, metal layer 401 may be deposited to connect a selected number but not all of VCSELs. The selected VCSELs may form a predetermined irregular pattern. Thus, an irregular pattern may be generated by depositing a metal layer to connect selected but not all elements from a regular array. Metal layer 402, on the other hand, is configured to connect the remaining VCSELs which are not selected or connected to layer 401. Thus, when an electrical current is charged via metal layer 401, the VCSEL array 400 functions as an irregular-patterned array because only those VCSEL emitters connected by metal layer 401 are lit up. On the other hand, when an electrical current is charged via both metal layers 401 and 402, all VCSELs are powered on. Then array 400 becomes a regular-patterned VCSEL array. Therefore, VCSEL array 400 may operate in two different modes, a regular-patterned array mode and an irregular-patterned array mode.

Alternatively, metal layers 401 and 402 may be fabricated as two electrically insulated portions of the same metal layer and achieve the same functions described above.

Figure 5:
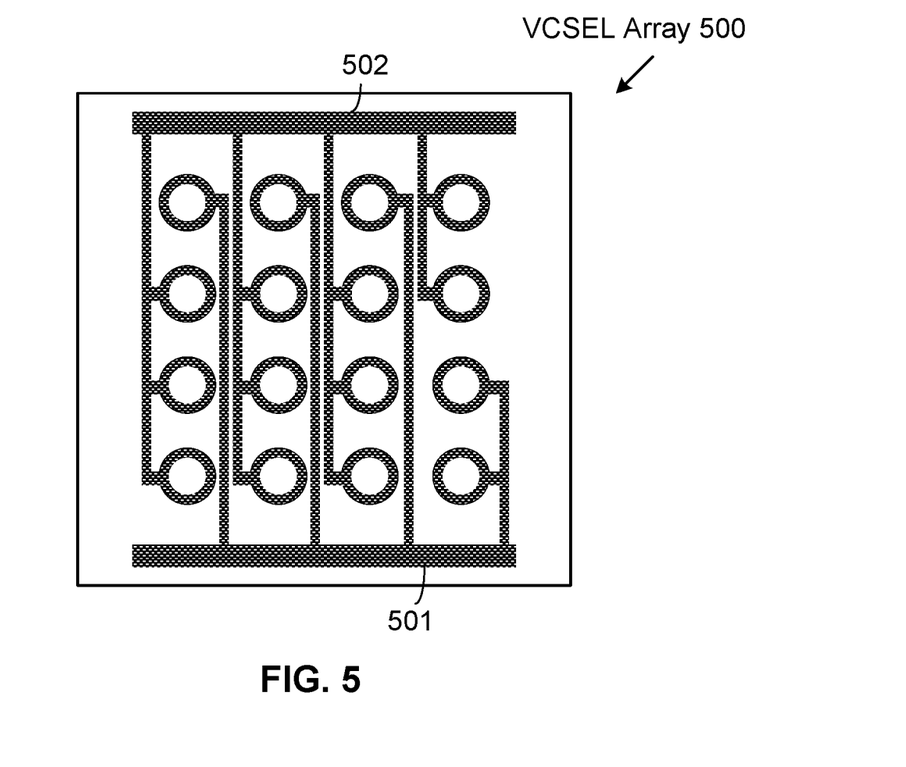
FIG. 5 illustrates an exemplary VCSEL array chip in a top view, according to one embodiment of the present invention.

FIG. 5 shows an exemplary VCSEL array 500 in a top view, according to one embodiment of the present invention. Note that this is not a cross-sectional view of the VCSEL Array 500 but a design view of the metals. The ring shaped objects represent metallic annular rings on the top surface of a VCSEL chip. The annular rings may be metal contacts or anode terminals of the VCSELs. Each annular ring encircles an output window of a VCSEL from where a laser beam is emitted. The short and long bars may represent two metal layers on the surface which electrically connects selected VCSELs respectively. Bond pads 501 and 502 are arranged for wire bonding. Bond wires may be bonded to connect the anode terminals of some VCSELs to a contact pad on a submount which carries the chip. Configuration of the annular rings illustrates a VCSEL array with a 4×4 matrix, i.e., an exemplary regular pattern. Bond pad 501 is connected to five VCSELs, which may be selected to form a predetermined pattern such as an irregular pattern. Thus, when an electrical current is charged via pad 501 and a common cathode terminal (not shown in the figure), VCSEL array 500 shows a predetermined pattern, such as a predetermined irregular pattern. When both pads 501 and 502 are used to charge an electrical current, all VCSELs are powered on. It becomes a VCSEL array of a regular pattern, a 4×4 matrix. Hence, the embodiment shown in FIG. 5 may be implemented to create a VCSEL array which has either a predetermined irregular pattern or a regular pattern. It should be noted that the above two metal layers may be fabricated as two insulated metal portions of the same metal layer and achieve the same functions described above.

Figure 6:
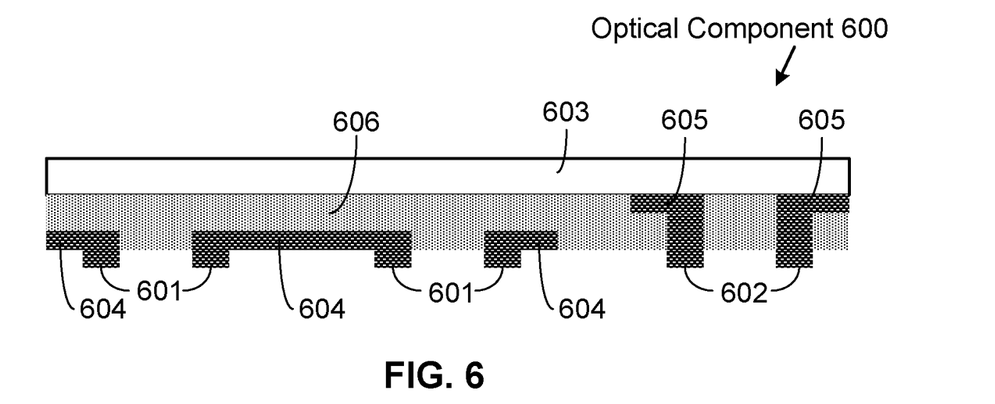
FIG. 6 illustrates a cross-sectional view of an exemplary optical component, according to two embodiments of the present invention.

Besides metal layers formed during the fabrication process of the VCSEL array, VCSELs of a regular-patterned array may also be selected to form a predetermined pattern by an external object, such as an optical component or a submount. FIG. 6 shows an exemplary optical component 600 in a cross-sectional view, which may be used to create a VCSEL array with either an irregular pattern or a regular pattern. Optical component 600 may be made using a base plate 603. Plate 603 may be made from a material which is transparent or substantially transparent at the wavelengths of interest. Its top and bottom surfaces may be coated with an antireflection layer to reduce reflection. Two metal layers 604 and 605 are deposited on plate 603 in a sequential manner using plating and lithographic processes. Alternatively, metal layers 604 and 605 may also be two portions formed from the same metal layer. The metal may be aluminum or copper. The sections of layer 604 and 605 are respectively connected (not shown in the figure) so that they are electrically two separate metal layers. Between the two metal layers is an insulation layer 606. Layer 606 may be arranged via a deposition process.

Like metal layers 401 and 402 of FIG. 4, layers 604 and 605 are used to create two patterns. They have contact pads 601 and 602 respectively. Contact pads 602 may be arranged to form a configuration which is a mirror image of a predetermined irregular pattern. After optical component 600 is mounted on a regular-patterned VCSEL array chip, contact pads 601 and 602 are connected to metal contacts of the VCSELs on the chip. The VCSELs, which are electrically connected to the contact pads 601, form the predetermined irregular pattern. In addition, all VCSELs on the chip may be electrically charged simultaneously via pads 601 and 602 to produce a regular pattern.

Figure 7:
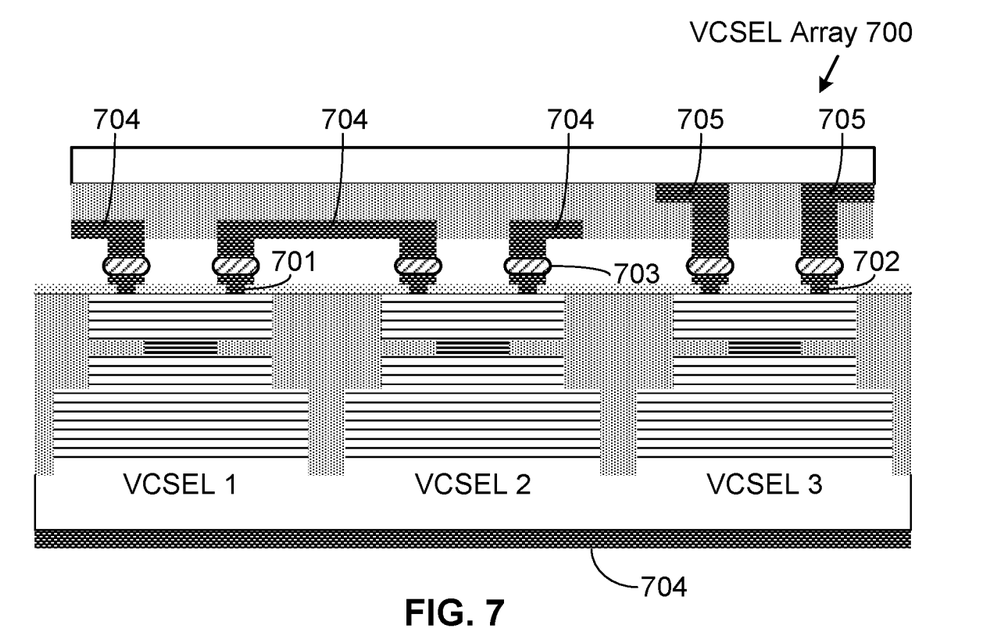
FIG. 7 illustrates a cross-sectional view of an exemplary VCSEL array, according to one embodiment of the present invention.

In FIG. 7, an exemplary VCSEL array 700 is illustrated in a cross-sectional view. It comprises a VCSEL array chip and an optical component attached to the chip. The chip contains a plurality of VCSELs, including VCSELs 1, 2, and 3, configured in a regular pattern. The VCSEL array chip may be fabricated by using the manufacturing process of a regular-patterned VCSEL array but without the metallization that completes the connection of the VCSELs. The optical component has two metal layers 704 and 705 deposited in a sequential manner on a downward facing surface. Alternatively, metal layers 704 and 705 may also be two portions of the same metal layer. Contact pads of the optical component which are connected to layer 704 are arranged in a mirror image of a predetermined pattern. As shown in the figure, VCSELs 1 and 2 have metal contacts 701. VCSEL 3 has metal contacts 702. Contact 701 and 702 are deposited on the p-type DBR reflector regions as the anode terminals of the VCSELs. The optical component is mounted on the VCSEL chip such that contact pads of the optical component are bonded with metal contacts 701 and 702 respectively. The contact pads are bonded on the chip by an electrically conductive adhesive material 703. Material 703 may be cured at an elevated temperature. As shown exemplarily, anode terminals of VCSELs 1 and 2 are electrically connected to metal layer 704, while the anode terminal of VCSEL 3 is connected to metal layer 705. The VCSELs have a common cathode terminal 704. Thus, when an electrical current is charged to VCSEL array 700 through metal layer 704, VCSELs 1 and 2, which are connected to the contact pads leading to metal layer 704, are powered on. VCSELs 1 and 2 form the predetermined pattern. Additionally, when both metal layers 704 and 705 are used to charge an electrical current, all VCSELs are powered on. Consequently, it becomes a regular-patterned VCSEL array. Therefore, an optical component may be used to make a VCSEL array have either a predetermined irregular pattern or a regular pattern. Because packaging processes are less complex than plating and lithographic processes, VCSEL array 700 may have advantages in cost and turnaround time over array 400.

Furthermore, an optical component may provide other functionalities in addition to presenting two patterns. For instance, optical structures may be created on the upward facing surface of an optical component. The structures may include lens-like objects generated by molding or etching processes. The lens-like objects may be aligned to each VCSEL and cause an output beam less or more divergent. Moreover, an optical system may be attached to an optical component to create a subassembly or an upgraded optical component. The optical system may contain certain optical elements or even complex lens systems. Thus an optical component may provide certain functionalities besides creating a predetermined irregular pattern and a regular pattern. As a subassembly may be manufactured in advanced or outsourced, it may increase production efficiency and cut cost and turnaround time.

Figure 8:
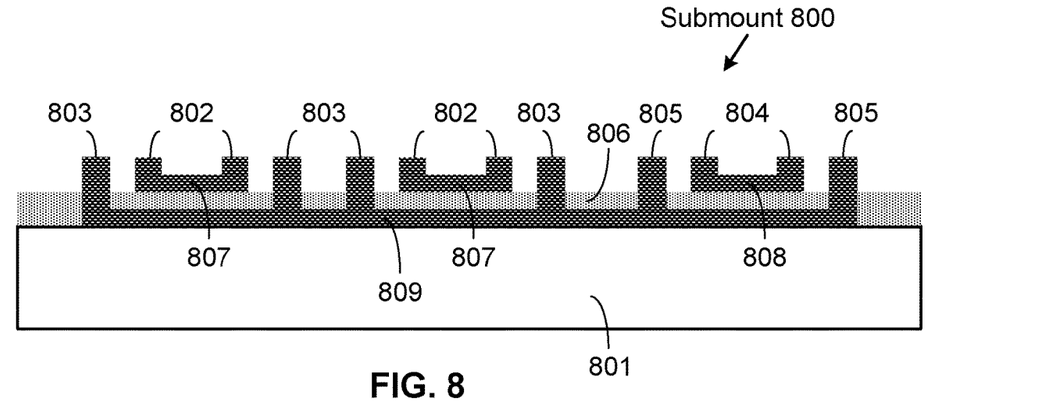
FIG. 8 illustrates a cross-sectional view of an exemplary submount, according to one embodiment of the present invention.

FIG. 8 illustrates an exemplary submount 800 in a cross-sectional view, according to the present invention. In above discussions, VCSELs are of the top-emitting type, which means that laser beams are emitted through the p-type DBR region in a direction opposite to the substrate. In some cases, a back-side-emitting VCSEL is used. The VCSEL chip is turned upside down and packaged using flip-chip methods. For a backside-emitting VCSEL chip with flip-chip bonding, output laser beams go through the substrate and the chip's anode and cathode terminals face downward towards a submount. In such situations, a submount may be used to create a VCSEL array with an irregular pattern from a regular-patterned array. The submount may work in a similar way to an optical component as shown in the above examples.

Submount 800 has a base plate 801, where contact pads 802, 803, 804, and 805 are electrically connected respectively by metal layers 807, 808, and 809. For instance, pads 802 are electrically connected by metal layer 807, pads 804 by metal layer 808, and pads 803 and 805 by metal layer 809. Metal layers 807 and 808 are deposited on the top surface of the submount. Metal layer 809 is embedded in an insulation layer 806. Metal layers 807 and 808 may be two portions of the same metal layer or different metal layers. Metal layer 809 may be a portion of a metal layer which is electrically insulated from layers 807 and 808. The contact pads may be fabricated using plating, etching, and lithographic techniques. The configuration of contact pads 802 or 803, which are connected respectively, may represent an image of a predetermined pattern, such as an irregular pattern. The image may be used to create a VCSEL array with the predetermined pattern.

Figure 9:
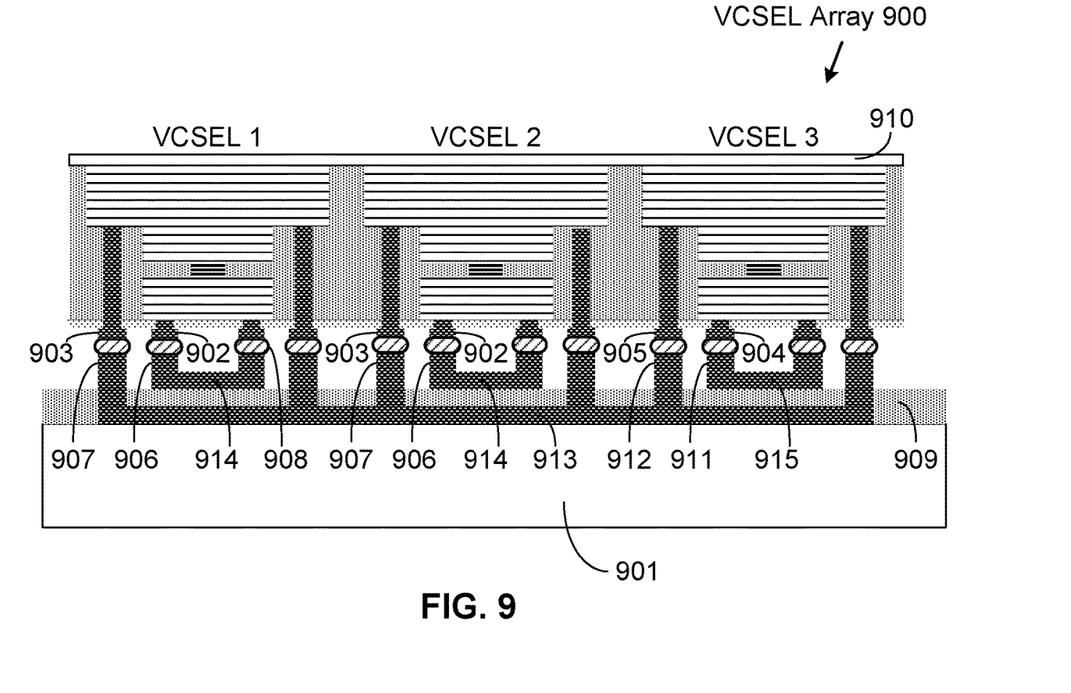
FIG. 9 illustrates a cross-sectional view of an exemplary VCSEL array, according to one embodiment of the present invention.

FIG. 9 illustrates an exemplary VCSEL array 900 in a cross-sectional view, according to the present invention. A VCSEL array die is flip-chip bonded on a submount. Before the die is mounted, its substrate portion is etched and an antireflection layer 910 is deposited to reduce reflection of an output laser beam. The die comprises VCSELs 1, 2, and 3 configured in a regular pattern. Metal contacts 902 and 903 are the anode and cathode terminals which are connected to the p-type DBRs and n-type DBRs of VCSELs 1 and 2 respectively. Metal contacts 904 and 905 are the anode and cathode terminals which are connected to the p-type DBR and n-type DBR of VCSEL 3 respectively. The submount has a base plate 901 and contact pads 906, 907, 911, and 912 deposited on the base plate. Contact pads 906 and 907 are arranged for VCSELs 1 and 2. Contact pads 911 and 912 are arranged for VCSEL 3. Metal contacts 902 and 903 of VCSELs 1 and 2 are bonded with contact pads 906 and 907 respectively by an electrically conductive adhesive material 908, while similarly metal contacts 904 and 905 of VCSEL 3 are bonded with contact pads 911 and 912 respectively.

Metal layers 914 and 915 may be two portions of the same metal layer or different metal layers. A metal layer 913 may be a portion of a metal layer which is electrically insulated from layers 914 and 915. Contact pads 906 which are aligned with metal contacts 902 are electrically connected by metal layer 914. Contact pads 911 which are aligned with metal contacts 904 are electrically connected by metal layer 915. Contact pads 907 and 912 which are aligned with metal contacts 903 and 905 respectively are electrically connected by metal layer 913. For instance, as shown in the figure, metal layers 914 and 915 may be deposited on the top surface of the submount, and metal layer 913 may be embedded in an insulation layer 909. Resultantly, the anode terminals of VCSELs 1 and 2 are electrically connected to metal layer 914, the anode terminal of VCSEL 3 is electrically connected to metal layer 915, and the cathode terminals of all VCSELs are connected to metal layer 913. Thus when the configuration of contact pads 906 or 907 represents an image of a predetermined pattern, VCSELs 1 and 2, which are connected to pads 906 and 907, form the predetermined pattern. When an electrical current is charged to the VCSELs through contact pads 906 and 907, only VCSELs 1 and 2 are turned on, which form a predetermined pattern defined by contact pads 906 or 907 on the submount. Resultantly, array 900 becomes a VCSEL array with a predetermined pattern, such as a predetermined irregular pattern.

VCSELs 1 and 2 are electrically insulated from VCSEL 3 and so are metal layers 914 and 915. Hence, when VCSELs 1 and 2 are turned on, VCSEL 3 is not affected electrically. However, when an electrical current is charged to the VCSELs though all contacting pads 906, 907, 911 and 912 on the submount, all VCSELs are turned on. Array 900 becomes a VCSEL array with the regular pattern. Therefore, like an optical component, a submount may be used to make a VCSEL array which may present either an irregular pattern or a regular pattern. Like the optical component method, the submount method has similar merits and advantages over prior art regular-patterned or irregular-patterned VCSEL arrays, such as improved cost and turnaround time.

Note that in the embodiments described above, the regular-patterned VCSEL arrays are divided into two subarrays, a first subarray is formed by using a first metal layer (e.g., metal layer 401 in FIG. 4 and metal layer 604 in FIG. 6) to connect a select number but not all of the plurality of VCSELs, and a second subarray is formed by using a second metal layer (e.g., metal layer 402 in FIG. 4 and metal layer 605 in FIG. 6) to connect the remaining VCSELs which are not connected to the first metal layer. And the first subarray could be in a predetermined irregular pattern. In another embodiment of the present invention, a regular-patterned VCSEL array may be divided into three or more subarrays by using three or more metal layers, and at least one of the subarrays is in a predetermined irregular pattern. In that case, the VCSEL array may be operated in three or more modes. It should be noted that all or some of the above metal layers may be fabricated as metal portions of a single metal layer, depending on the given circumstances and considerations.

Figure 10:
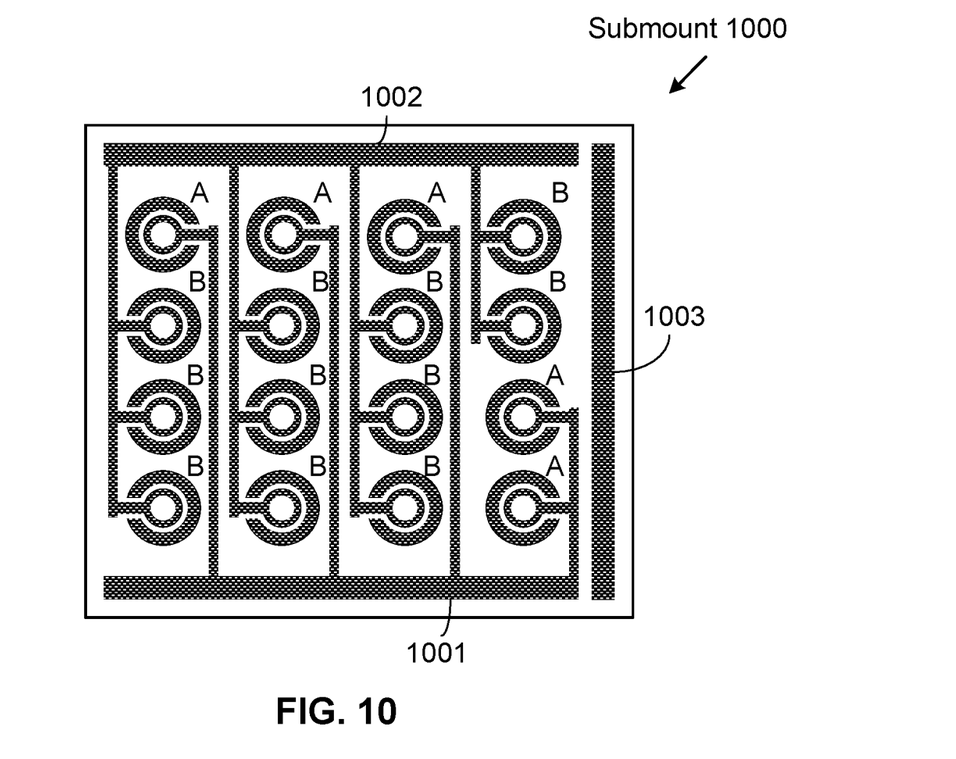
FIG. 10 illustrates an exemplary submount in a top view, according to the present invention.

FIG. 10 illustrates an exemplary submount 1000 in a top view, according to the present invention. The concentric rings may represent a pair of metallic contact pads deposited on the submount. The inner ring may represent a contact pad to be connected to an anode terminal of a VCSEL. The outer ring may represent a contact pad to be connected to a cathode terminal of a VCSEL. As aforementioned, the outer rings, to be connected to VCSELs' cathode terminals, may be electrically connected by a metal layer (not shown in the figure) beneath the surface, which may be embedded in an insulation layer on a base plate of the submount. The embedded metal layer has a contact area 1003 which may be used as a bonding pad for wire bonding. The submount makes VCSELs of a VCSEL die have a common cathode. Metal layers 1001 and 1002 may be two separate portions of a metal layer. The inner rings may be electrically connected to a corresponding metal layer respectively. In FIG. 10 for instance, inner rings marked by letter A are electrically connected to metal layer 1001 and inner rings marked by letter B are electrically connected to metal layer 1002.

Thus, after a VCSEL die with a 4×4 matrix configuration, i.e., a regular pattern, is flip-chip mounted on submount 1000, each pair of the inner and outer rings are connected to an anode and cathode terminal of a VCSEL. When an electrical current is charged to the VCSELs through metal layer 1001, only VCSELs corresponding to a pair of rings marked with letter A are turned on, which may form a predetermined pattern. Resultantly, a VCSEL array with a predetermined pattern is generated. When an electrical current is charged to the VCSELs through metal layers 1001 and 1002 together, all VCSELs are turned on, A VCSEL array with the 4×4 matrix configuration, a regular pattern, is generated. Therefore, a VCSEL array with a regular pattern may be turned into an array with an irregular pattern or a regular pattern using a submount method.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

The invention claimed is:

1. A Vertical Cavity Surface Emitting Laser (VCSEL) array, comprising:
 a substrate;
 a plurality of VCSEL structures formed on the substrate in a regular pattern, each VCSEL structure comprising a first reflector region, an active region, and a second reflector region, wherein the plurality of VCSEL structures can be powered on at the same time;
 a first metal that electrically connects a selected number but not all of the VCSEL structures so that the selected number of the VCSEL structures form a predetermined irregular pattern of light emitters when only the selected number of the VCSEL structures are powered on;
 a second metal that electrically connects at least some of the VCSEL structures which are not electrically connected to the first metal, wherein the first metal and the second metal are electrically insulated from each other; and
 an optical component, wherein the first and second metals are deposited on the optical component and the optical component is fixed above the VCSEL structures during a packaging process.

2. The VCSEL array of claim 1, wherein the regular pattern comprises a plurality of rows and VCSEL structures in each row are spaced apart in equal distance.

3. The VCSEL array of claim 1, wherein the regular pattern comprises a plurality of concentric circles and VCSEL structures in each circle are spaced apart in equal distance.

4. The VCSEL array of claim 1, wherein the predetermined irregular pattern is a random or pseudorandom pattern.

5. The VCSEL array of claim 1 further comprises a different contact for each VCSEL structure.

6. The VCSEL array of claim 1, wherein the optical component comprises a plurality of optical lenses or an optical system.

7. The VCSEL array of claim 1, wherein the active region comprises a multiple-quantum-well (MQW) structure, the first reflector region comprises an n-type Distributed Bragg Reflector (DBR), and the second reflector region comprises a p-type DBR.

8. The VCSEL array of claim 1 further comprises a third metal that electrically connects all VCSEL structures which are not electrically connected to the first metal or second metal, wherein the third metal is electrically insulated from the first metal and the second metal.

9. The VCSEL array of claim 1, wherein the first metal and the second metal are portions of a same metal layer.

10. The VCSEL array of claim 1, wherein the first metal comprises a first metal layer and the second metal comprises a second metal layer.

11. A Vertical Cavity Surface Emitting Laser (VCSEL) array, comprising:
- a submount;
- a plurality of VCSEL structures formed in a regular pattern, each VCSEL structure comprising a first reflector region, an active region, and a second reflector region, wherein the plurality of VCSEL structures are mounted on the submount via flip-chip method and can be powered on at the same time;
- a first metal and a second metal that electrically connect anode and cathode terminals of a selected number but not all of the VCSEL structures respectively so that the selected number of the VCSEL structures form a predetermined irregular pattern of light emitters when only the selected number of the VCSEL structures are powered on; and
- a third metal and a fourth metal that electrically connect anode and cathode terminals of at least some of the VCSEL structures which are not electrically connected to the first metal, wherein the first, second, third, and fourth metals are deposited on the submount.

12. The VCSEL array of claim 11, wherein the regular pattern comprises a plurality of rows and VCSEL structures in each row are spaced apart in equal distance.

13. The VCSEL array of claim 11, wherein the irregular pattern comprises a random pattern or pseudorandom pattern.

14. The VCSEL array of claim 11 further comprises a fifth metal and a sixth metal that electrically connects anode and cathode terminals of all VCSEL structures, which are not electrically connected to the first or third metal.

15. The VCSEL array of claim 11, wherein the second and fourth metals are portions of a same metal layer.

16. The VCSEL array of claim 11, wherein the first metal and third metal are insulated portions of a same metal layer.

17. The VCSEL array of claim 11, wherein the first metal comprises a first metal layer and the third metal comprises a third metal layer.

* * * * *